(12) United States Patent
Chiu et al.

(10) Patent No.: US 11,075,275 B2
(45) Date of Patent: Jul. 27, 2021

(54) METAL GATE FILL FOR SHORT-CHANNEL AND LONG-CHANNEL SEMICONDUCTOR DEVICES

(71) Applicant: Taiwan Semiconductor Manufacturing Co., Ltd., Hsinchu (TW)

(72) Inventors: Shih-Hang Chiu, Taichung (TW); Chung-Chiang Wu, Taichung (TW); Ching-Hwanq Su, Tainan (TW); Da-Yuan Lee, Jhubei (TW); Ji-Cheng Chen, Hsinchu (TW); Kuan-Ting Liu, Hsinchu (TW); Tai-Wei Hwang, Kinmen (TW); Chung-Yi Su, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/909,815

(22) Filed: Mar. 1, 2018

(65) Prior Publication Data
US 2019/0273145 A1    Sep. 5, 2019

(51) Int. Cl.
*H01L 29/49* (2006.01)
*H01L 27/088* (2006.01)
*H01L 21/3213* (2006.01)
*H01L 21/28* (2006.01)
*H01L 21/285* (2006.01)
*H01L 29/51* (2006.01)
*H01L 21/8234* (2006.01)

(52) U.S. Cl.
CPC .... *H01L 29/4966* (2013.01); *H01L 21/28088* (2013.01); *H01L 21/28556* (2013.01); *H01L 21/32133* (2013.01); *H01L 21/823456* (2013.01); *H01L 27/088* (2013.01); *H01L 29/517* (2013.01); *H01L 21/82345* (2013.01)

(58) Field of Classification Search
CPC ......... H01L 29/66606; H01L 29/66871; H01L 29/66545; H01L 27/0924; H01L 21/823821; H01L 21/82385; H01L 21/823842; H01L 21/823456; H01L 29/4966; H01L 29/517; H01L 21/28556; H01L 21/32133; H01L 27/088; H01L 21/28088
See application file for complete search history.

(56) References Cited

U.S. PATENT DOCUMENTS

| | | | |
|---|---|---|---|
| 2013/0243940 A1* | 9/2013 | Kamath | H01Q 1/2283 427/97.1 |
| 2015/0270177 A1* | 9/2015 | Tseng | H01L 21/823857 438/216 |
| 2016/0093617 A1* | 3/2016 | Park | H01L 29/785 257/369 |
| 2016/0351569 A1* | 12/2016 | Song | H01L 29/4966 |
| 2017/0125298 A1 | 5/2017 | Jangjian et al. | |
| 2017/0194209 A1* | 7/2017 | Li | H01L 27/088 |
| 2018/0337247 A1* | 11/2018 | Chen | H01L 23/485 |

\* cited by examiner

*Primary Examiner* — Nelson Garces
(74) *Attorney, Agent, or Firm* — Slater Matsil, LLP

(57) ABSTRACT

Certain embodiments of a semiconductor device and a method of forming a semiconductor device comprise forming a high-k gate dielectric layer over a short channel semiconductor fin. A work function metal layer is formed over the high-k gate dielectric layer. A seamless metal fill layer is conformally formed over the work function metal layer.

20 Claims, 9 Drawing Sheets

METAL GATE FILL FOR SHORT-CHANNEL AND LONG-CHANNEL SEMICONDUCTOR DEVICES

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. Such scaling down has increased the complexity of processing and manufacturing ICs. For these advances to be realized, similar developments in IC manufacturing are needed.

As the semiconductor IC industry has progressed into nanometer technology process nodes in pursuit of higher device density, higher performance, and lower costs, challenges from both fabrication and design have resulted in the development of three-dimensional (3D) devices, such as fin field effect transistors (FinFETs). Advantages of FinFET devices include reducing the short channel effect and increasing the current flow. There has been a desire to use a FinFET device with a high-k gate dielectric and a metal gate electrode to improve device performance as feature sizes continue to decrease.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
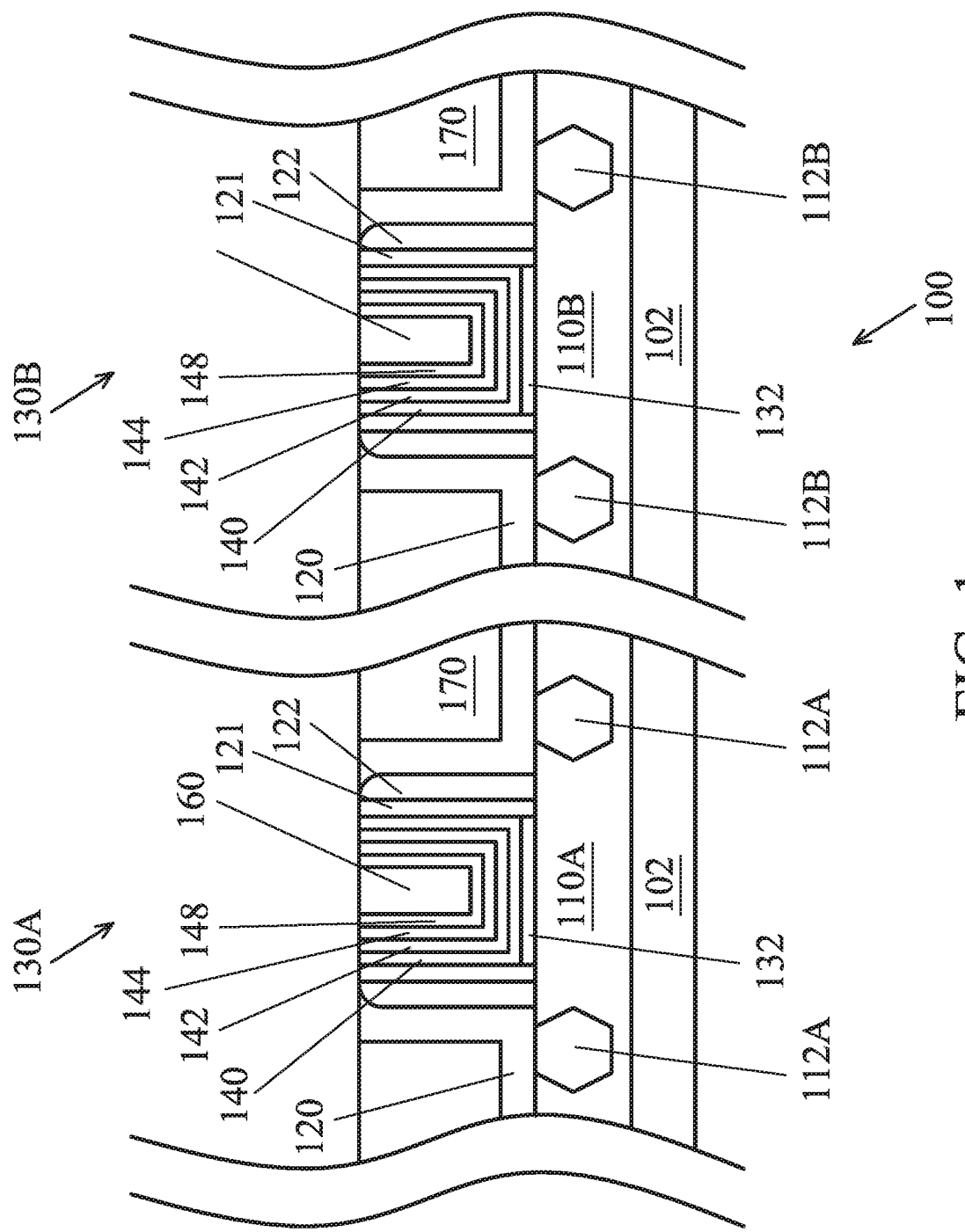
FIG. 1 is a schematic cross-sectional diagram of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Certain embodiments provide a semiconductor device with a gate-fill, such as a FinFET device with a replacement gate structure formed with a metal fill layer, which may be seamless. In certain embodiments, a seamless metal fill layer is formed in a replacement gate structure over a short channel to form a short channel FinFET device. In certain embodiments, a titanium aluminum nitride (TiAlN) layer forms a seamless metal fill layer over a short channel and forms a glue layer for another metal fill layer over a longer channel to respectively form a short channel FinFET device and a long channel FinFET device.

FIG. 1 is a schematic cross-sectional diagram of a semiconductor device 100 in accordance with some embodiments. The semiconductor device 100 includes a semiconductor substrate 102, a semiconductor fin 110A, a second semiconductor fin 110B, a first gate structure 130A, and a second gate structure 130B. The semiconductor fin 110A and the semiconductor fin 110B are formed on the semiconductor substrate 102 in separate regions. In some embodiments, the semiconductor fins 110A, 110B protrude from between neighboring isolation structures (not shown), which may be shallow trench isolation (STI) structures, on the semiconductor substrate 102. The semiconductor substrate 102, such as a wafer or other types of substrates, may be or comprise silicon, group III semiconductor materials, group IV semiconductor materials, group V semiconductor materials, compounds thereof, and alloys thereof. Examples of elementary semiconductor materials may include, but are not limited to, silicon and germanium, which may be monocrystalline or may be polycrystalline. Examples of compound semiconductor materials may include, but are not limited to, silicon carbide, gallium arsenic, gallium phosphide, indium phosphide, indium arsenide, and/or indium antimonide. Examples of alloy semiconductor materials may include, but are not limited to, SiGe, GaAsP, AlInAs, AlGaAs, GaInAs, GaInP, and/or GaInAsP.

The semiconductor fins 110A and 110B protrude from the semiconductor substrate 102 and/or are formed over the semiconductor substrate 102. The semiconductor fins 110A, 110B comprise a semiconductor material, such as silicon (Si), silicon germanium (SiGe) alloy, germanium (Ge), group III-V semiconductor materials, compounds thereof, alloys thereof, or other suitable materials. The semiconductor fins 110A, 110B may comprise the same or may comprise different materials. For example, a semiconductor fin 110A, which may be implemented in an n-type device such as an n-type FinFET, may comprise Si, and a semiconductor fin 110B, which may be implemented in a p-type device such as a p-type FinFET, may comprise SiGe.

Offset spacers 121, such as silicon nitride offset spacers, may be formed along the sides of the first gate structure 130A and the second gate structure 130B. Gate spacers 122 are formed on respective sidewalls of the offset spacers 121. The gate spacers 122 may include silicon oxide, silicon nitride, silicon oxynitride, or other dielectric materials. Source/drain portions 112A are disposed in the semiconductor fin 110A on opposing sides of the first gate structure 130A and proximate to respective gate spacers 122. The source/drain portions 112A, a channel portion in the semiconductor fin 110A, and the first gate structure 130A can form an n-type FinFET device, for example. Source/drain portions 112B are disposed in the semiconductor fin 110B on opposing sides of the second gate structure 130B and proximate respective gate spacers 122. The source/drain portions 112B together with the second gate structure 130B forms a p-type FinFET device. The source/drain portions 112A, 112B comprise a semiconductor material, such as silicon (Si), silicon germanium (SiGe), silicon carbide (SiC), germanium (Ge), group III-V semiconductor materials, compounds thereof, alloys thereof, or other suitable materials. The source/drain portions 112A, 112B may comprise the same or may comprise different materials. For example, a source/drain 112A of an n-type FinFet device may comprise silicon phosphorus (SiP) or silicon carbide phosphorus (SiCP) and a source/drain 112B of a p-type FinFET device may comprise silicon germanium (SiGe).

In some embodiments, an etch stop layer 120 overlies the gate spacer 122 and the source/drains 112A, 112B. The etch stop layer 120 may comprise silicon nitride, silicon carbon nitride, silicon carbon oxide, carbon nitride, the like, or combinations thereof. An inter-layer dielectric (ILD) 170 overlies the etch stop layer 120. The ILD 170 may include silicon oxide, phosphosilicate glass (PSG), borophosphosilicate glass (BPSG), and other suitable materials.

The first gate structure 130A and the second gate structure 130B include an interfacial dielectric 132, a high-k gate dielectric layer 140, a capping metal layer 142, a barrier metal layer 144, a work function metal layer 148, and a metal fill layer 160. One or more work function layers are chosen to tune the work function value of the FinFET devices so that a desired threshold voltage Vt can be achieved in the transistor that is formed.

Figure 2:
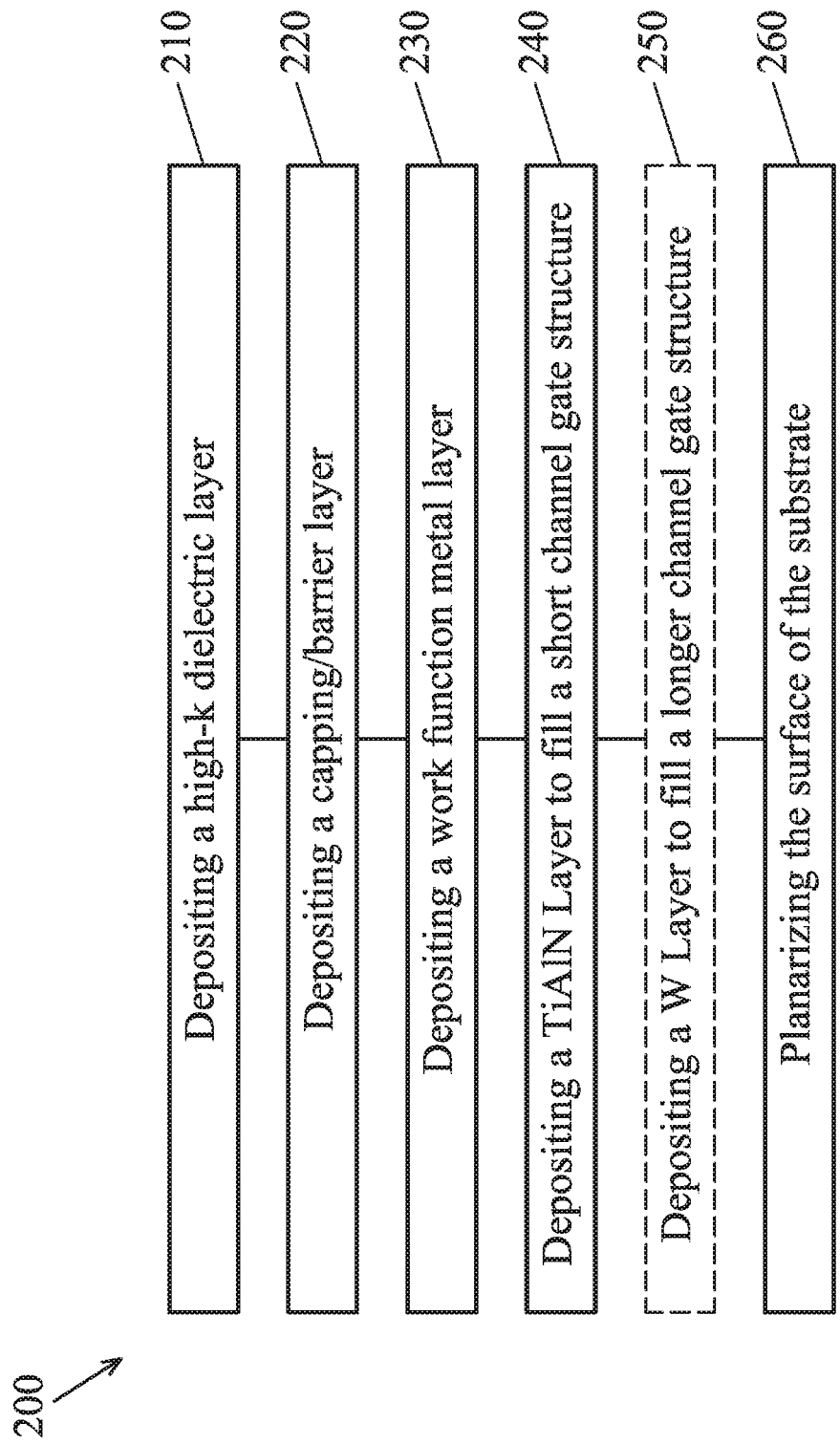
FIG. 2 is a flow diagram illustrating a method of manufacturing a semiconductor device in accordance with some embodiments.

FIG. 2 is a flow diagram illustrating a method 200 of manufacturing a semiconductor device, such as a gate structure over a fin structure to form part of a FinFET semiconductor device in accordance with some embodiments. The method 200 is described in reference to FIG. 3 through FIG. 9, which are schematic diagrams of various stages of manufacturing a gate structure 130 over a semiconductor fin 110 formed on a semiconductor substrate 102. The method 200 is described in reference to forming a gate structure 130, which may be either a gate structure for a p-type FinFET device and/or for an n-type FinFET device. In manufacturing gate structures for different FinFET devices, one or more layers that form the respective FinFET devices may be deposited at the same or different times. For example, a metal fill layer over a short channel gate structure may be deposited at the same time over trench structures to form respective gate structures for an n-type FinFET device and a p-type FinFET device. In another example, a work function metal layer of a gate structure for an n-type FinFET device and a work function metal layer of a gate structure for a p-type FinFET device may be deposited at different times to tune the different work functions for the n-type and p-type FinFET devices.

Figure 3:
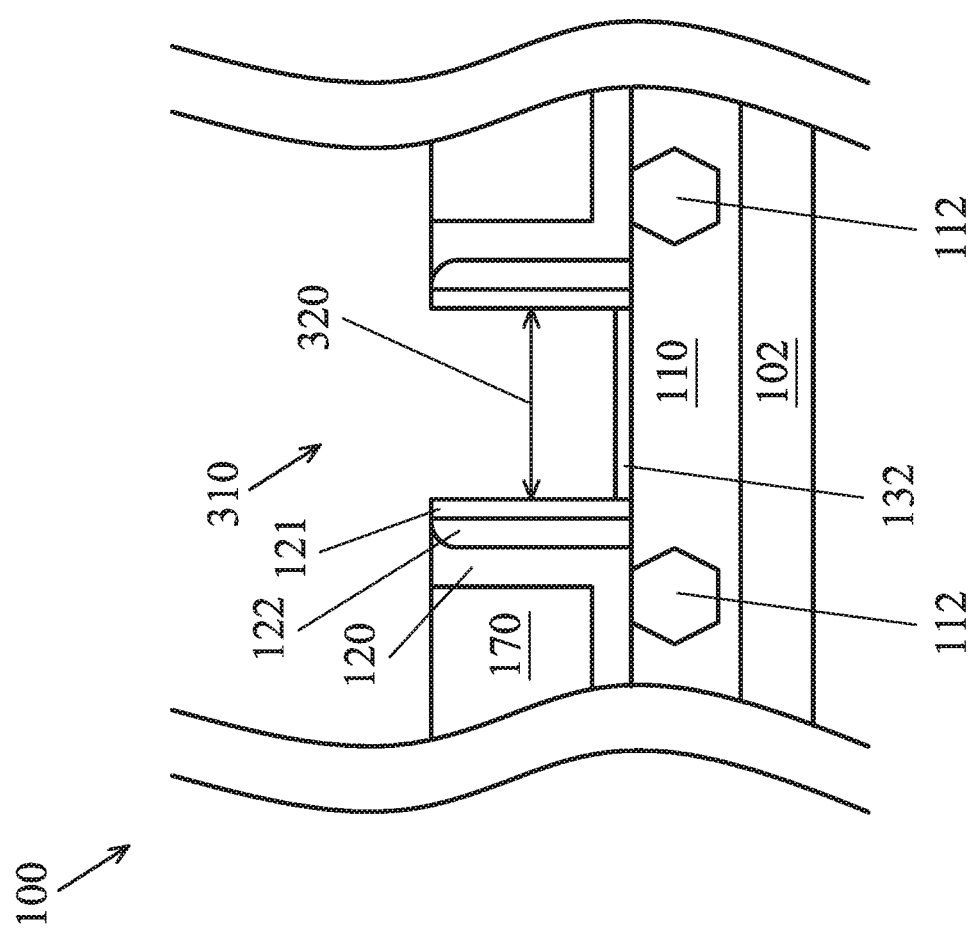
FIG. 3 is a schematic cross-sectional view of a semiconductor substrate at one stage of manufacturing a semiconductor device with a dummy gate removed in accordance with some embodiments.

FIG. 3 is a schematic cross-sectional view of a semiconductor substrate 102 at one stage of manufacturing a semiconductor device 100 as part of a replacement gate process, such as for a gate structure for an n-type device or a p-type device. A substrate 102 includes isolation structures (not explicitly shown) separating semiconductor fins 110. Source/drain portions 112 may be formed in contact with the semiconductor fin 110. A dummy gate has been removed from the substrate 102 leaving a trench 310 within an inter-layer dielectric (ILD) 170. The trench is formed over the semiconductor fin 110. After removal of the dummy gate, an interfacial dielectric 132 may remain at the bottom of the trench 130 to protect the semiconductor fin 110 in the removal process of the dummy gate. The interfacial dielectric 132 is formed on sidewalls and top surfaces of the semiconductor fins 110 along the channel regions. The interfacial dielectric 132 may be a silicon oxide, silicon oxynitride, and/or another dielectric layer.

The trench is bounded on the sides by offset spacers 121 to define a channel length 320. In certain embodiments, the channel length 320 of the trench 310 is sized for a short channel length gate. In one embodiment, a channel length 320 is in a range from about 2 nanometers (nm) to about 10 nm for a short channel length gate.

Figure 4:
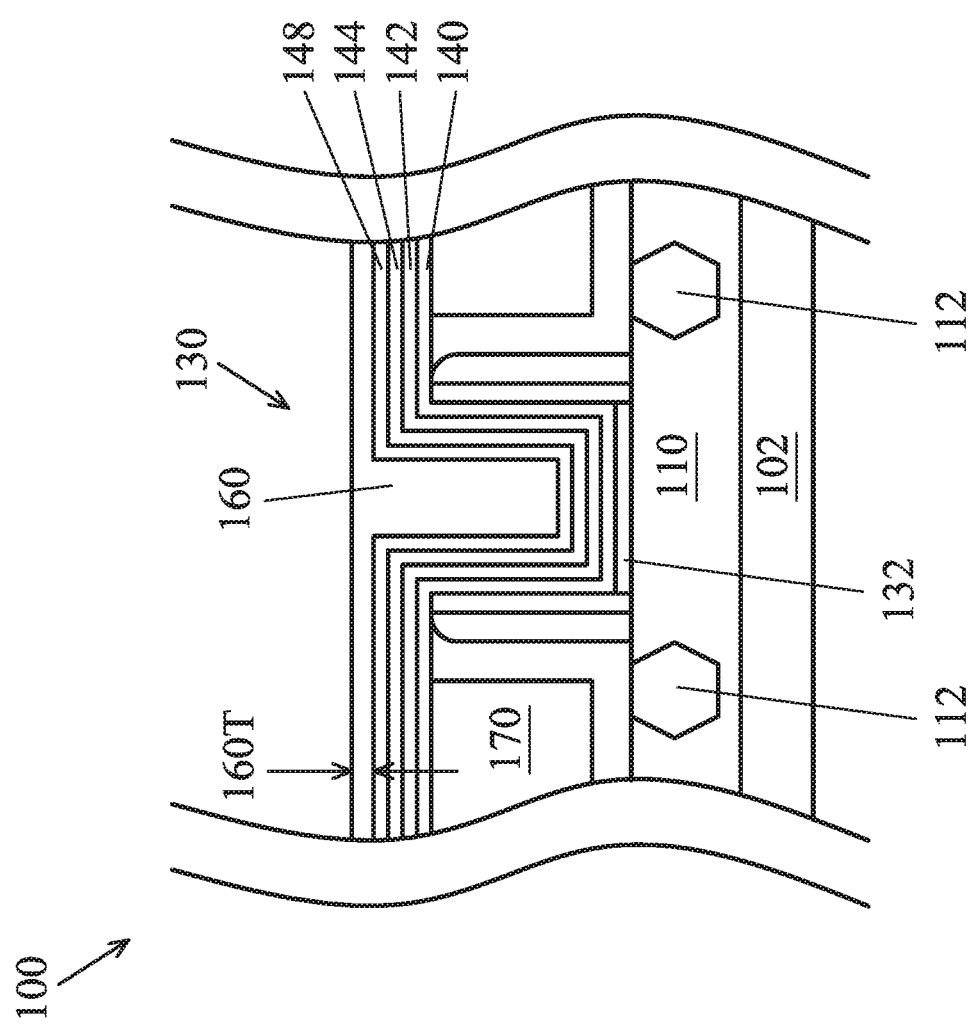
FIG. 4 is a schematic cross-sectional view of a semiconductor substrate at one stage of manufacturing a semiconductor device by depositing a plurality of layers as part of a replacement gate process in accordance with some embodiments.

At block 210 of the method 200 of FIG. 2, a high-k gate dielectric layer 140 is deposited conformally in the trench 310 of FIG. 3 as shown in FIG. 4 to form part of a gate structure 130. The high-k gate dielectric layer 140 is deposited conformally over the semiconductor fin 110 and along sidewalls of the offset spacers 121. The high-k gate dielectric layer 140 may be conformally deposited in the trench 310 where the dummy gate was removed (e.g., on the interfacial dielectric 132, on the sidewalls of the offset spacers 121) and on the top of the interlayer dielectric 170. The high-k gate dielectric layer 140 may have a thickness ranging from about 5 angstroms to about 20 angstroms. In some embodiments, the high-k gate dielectric layer 140 may have a k value (dielectric constant) greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. For example, a high-k gate dielectric layer 140 may comprise hafnium oxide ($HfO_2$) hafnium silicon oxide (HfSiO), hafnium silicon oxynitride (HfSiON), hafnium tantalum oxide (HfTaO), hafnium titanium oxide (HMO), hafnium zirconium oxide (HfZrO), or combinations thereof. The high-k gate dielectric layer 140 may be conformally deposited, such as by chemical vapor deposition processes, such as by plasma-enhanced CVD (PECVD), metal-organic CVD (MOCVD), atomic layer deposition, cyclic deposition, or other suitable deposition processes.

At block 220 of the method 200 of FIG. 2, a capping metal layer 142 and/or a barrier layer 144 may deposited over the high-k gate dielectric layer 140. The capping metal layer 142 includes titanium nitride (TiN), tantalum nitride (TaN), multiple films thereof, and other suitable layers. The capping metal layer 142 may have a thickness ranging from about 5 angstroms to about 20 angstroms. The capping metal layer 142 may be conformally deposited, such as by chemical vapor deposition processes, including plasma-enhanced CVD (PECVD), metal-organic CVD (MOCVD), atomic layer deposition, or cyclic deposition, or other suitable deposition processes.

The barrier metal layer 144 may be deposited over the capping metal layer 142. The barrier metal layer 144 may comprise tantalum nitride (TaN), titanium nitride (TiN), multiple films thereof, and other suitable layers. The barrier metal layer 144 may have a thickness ranging from about 5 angstroms to about 20 angstroms. The barrier layer 144 may be conformally deposited, such as by chemical vapor deposition processes, including plasma-enhanced CVD (PECVD), metal-organic CVD (MOCVD), atomic layer deposition, cyclic deposition, or other suitable deposition processes. The capping metal layer 142 and the barrier metal layer 144 may be implemented to prevent impurities from entering underlying layers or from diffusing out of underlying layers. In certain embodiments, the capping metal layer 142 and the barrier metal layer 144 may be a combined layer.

At block 230 of the method 200 of FIG. 3, a work function metal layer 148 is deposited over the barrier layer 144. Examples of a work function metal layer 148 for a gate structures for n-type FinFET devices include Ti, Ag, TaAl, TaAlC, TiAlN, TaC, TaCN, TaSiN, Mn, Zr, other suitable work function materials, or combinations thereof. Examples of a work function metal layer 148 for p-type FinFET devices include TiN, TaN, Ru, Mo, Al, WN, $ZrSi_2$, $MoSi_2$, $TaSi_2$, $NiSi_2$, WN, other suitable work function materials, or combinations thereof. The work function metal layer 148 may have a thickness ranging from about 20 angstroms to about 100 angstroms. The work function metal layer 148 may be conformally deposited, such as by chemical vapor deposition processes, including plasma-enhanced CVD (PECVD), metal-organic CVD (MOCVD), atomic layer deposition, or cyclic deposition, or other suitable deposition processes.

At block 240, a metal fill layer 160, such as a TiAlN layer, is deposited over the work function metal layer 148 to fill the trench. The metal fill layer 160 may be deposited over the work function metal layer 148 to form a gate structure for an n-type FinFET device and/or a p-type FinFET device.

The metal fill layer 160 comprises a ternary alloy, such as a titanium aluminum nitride (TiAlN) alloy. In certain embodiments, the TiAlN metal fill layer comprises aluminum in an atomic percent content in a range from about 3% to about 20%. A TiAlN metal fill layer comprising aluminum in an atomic percent content less than 3% may cause undesirable formation of an intrinsic seam exposing layers therebelow to damage. A TiAlN metal fill layer comprising aluminum in an atomic percent content greater than 20% may cause undesirable formation of pores in the TiAlN metal fill layer resulting in a reduction of the conductivity of the gate structure.

In certain embodiments, the TiAlN metal fill layer comprises an atomic ratio of aluminum to titanium in a range from about 1:3 to about 4:1. In certain embodiments, the TiAlN metal fill layer also comprises an atomic ratio of nitrogen to oxygen in a range from about 1:10 to about 1:6. A TiAlN metal fill layer comprising an atomic ratio of aluminum to titanium lower than 1:3 may result in undesirable formation of an intrinsic seam exposing layers therebelow to damage. A TiAlN metal fill layer comprising an atomic ratio of aluminum to titanium greater than 4:1 may cause undesirable formation of pores in the TiAlN metal fill layer resulting in a reduction of the conductivity of the gate structure.

In certain embodiments, the metal fill layer 160 is deposited to a thickness 160T in a range from about 5 Å to about 40 Å. The thickness 160T of the metal fill layer is defined as thickness over a top surface of the ILD 170. For example, in some instances, deposition of the metal fill layer 160 to a thickness 160T of less than 5 Å may result in partial or incomplete fill of the trench 310 of a short channel FinFET structure. For example, in some instances, deposition of the metal fill layer 160 to a thickness 160T of more than 40 Å may not allow sufficient size of a remaining trench for deposition of a second metal fill layer thereover for a long channel FinFET structure.

Figure 5:
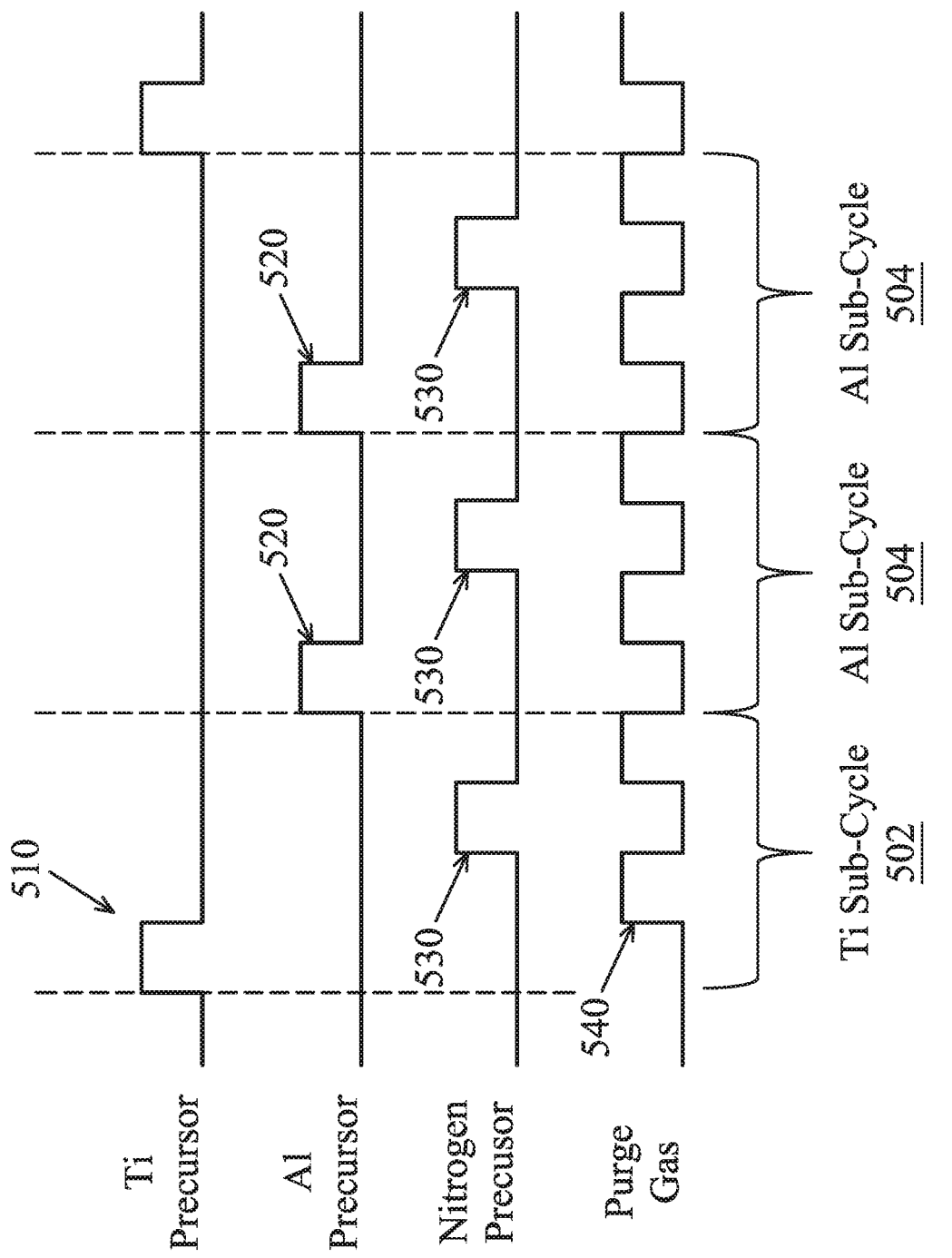
FIG. 5 is a schematic diagram illustrating the flow of gases for cyclic deposition of a ternary TiAlN compound according to some embodiments.

In certain embodiments, the metal fill layer 160 is deposited by cyclic deposition. FIG. 5 is a schematic diagram illustrating the flow of gases for cyclic deposition of a ternary TiAlN compound according to some embodiments. In cyclic deposition, multiple cycles of precursors are flowed to a surface of a substrate to deposit a layer thereover. As shown in FIG. 5, cyclic deposition of TiAlN includes a titanium sub-cycle 502 to form titanium nitride and an aluminum sub-cycle 504 to form aluminum nitride. The titanium sub-cycle 502 and the aluminum sub-cycle 504 are typically performed in the same deposition chamber.

The titanium sub-cycle 502 includes providing a pulse 510 of a titanium precursor, such as titanium chloride ($TiCl_4$), and a pulse 530 of a nitrogen precursor, such an ammonia gas ($NH_3$), to form titanium nitride. A pulse 540 of a purge gas may help to remove excess titanium precursor and nitrogen precursor on the surface of the substrate to help provide monolayer or atomic layer growth. Instead of a pulse of a purge gas, a pump down of sufficient duration between the pulse 510 of the titanium precursor and the pulse 530 of the nitrogen precursor may be used to help to remove excess titanium precursor and nitrogen precursor on the surface of the substrate to help provide monolayer or atomic layer growth. In certain embodiments, a plasma may also be provided during the titanium sub-cycle 502. For example, the pulse 530 of a nitrogen precursor may be provided as a plasma. In some circumstances, less than a monolayer may form due to partial adsorption or partial reaction of the titanium precursor and the nitrogen precursor. In some circumstances, more than a monolayer may form due to only partial or no removal of excess titanium precursor and nitrogen precursor on the surface of the substrate. Other titanium precursors may be used, such as titanium iodide ($TiI_4$), titanium bromide ($TiBr_4$), tetrakis (dimethylamido) titanium (TDMAT), tetrakis (diethylamido) titanium (TDEAT), tetrakis (diethylamido) titanium (TDEAT), and other suitable titanium precursors. Other nitrogen precursors may be used such as hydrazine ($N_2H_4$), monomethyl hydrazine ($CH_3N_2H_3$), dimethyl hydrazine ($C_2H_6N_2H_2$), t-butylhydrazine (C$_4$H$_9$N$_2$H$_3$), phenylhydrazine (C$_6$H$_5$N$_2$H$_3$), 2,2'-azoisobutane ((CH$_3$)$_6$C$_2$N$_2$), ethylazide (C$_2$H$_5$N$_3$), nitrogen (N$_2$), other suitable nitrogen precursors, and combinations thereof.

The aluminum sub-cycle 504 includes providing a pulse 520 of an aluminum precursor, such as aluminum chloride (AlCl$_3$), and a pulse 530 of a nitrogen precursor, such an ammonia gas (NH$_3$), to form aluminum nitride. A pulse 540 of a purge gas may help to remove excess aluminum precursor and nitrogen precursor on the surface of the substrate to help provide monolayer or atomic layer growth. Instead of a pulse of a purge gas, a pump down of sufficient duration between the pulse 520 of the aluminum precursor and the pulse 530 of the nitrogen precursor may be used to help to remove excess aluminum precursor and nitrogen precursor on the surface of the substrate to help provide monolayer or atomic layer growth. In certain embodiments, a plasma may also be provided during the aluminum sub-cycle. For example, the pulse 530 of a nitrogen precursor may be provided as a plasma. In some circumstances, less than a monolayer may form due to partial adsorption or partial reaction of the aluminum precursor and the nitrogen precursor. In some circumstances, more than a monolayer may form due to only partial or no removal of excess aluminum precursor and nitrogen precursor on the surface of the substrate. Other aluminum precursors may be used, such as tris (tertbutyl) aluminum (TTBA), trimethyl aluminum (TMA), or other suitable aluminum precursors. Other nitrogen precursors may be used such as hydrazine (N$_2$H$_4$), monomethyl hydrazine (CH$_3$N$_2$H$_3$), dimethyl hydrazine (C$_2$H$_6$N$_2$H$_2$), t-butylhydrazine (C$_4$H$_9$N$_2$H$_3$), phenylhydrazine (C$_6$H$_5$N$_2$H$_3$), 2,2'-azoisobutane ((CH$_3$)$_6$C$_2$N$_2$), ethylazide (C$_2$H$_5$N$_3$), nitrogen (N$_2$), other suitable nitrogen precursors, and combinations thereof.

In certain embodiments, the metal fill layer 160 is deposited by providing a number of aluminum sub-cycles versus a number of titanium sub-cycles in ratio in a range from about 1:4 to about 4:1, preferably in a ratio in a range from about 5:4 to about 4:1. A TiAlN metal fill layer deposited with a number of aluminum sub-cycles versus a number of titanium sub-cycles in a ratio less than 1:4 may cause undesirable formation of an intrinsic seam exposing layers therebelow to damage. A TiAlN metal fill layer deposited with a number of aluminum sub-cycles versus a number of titanium sub-cycles in an ratio greater than 4:1 may cause undesirable formation of a porous metal fill layer resulting in a reduction of the conductivity of the gate structure. In certain embodiments, the metal fill layer 160 comprising TiAlN is deposited by providing a number of aluminum sub-cycles versus a number of titanium sub-cycles in ratio in a range from about 5:4 to about 4:1

In certain embodiments, the increased aluminum atomic percent content of the TiAlN metal fill layer 160 (such as a TiAlN metal fill layer comprising aluminum in an atomic percent content of 2 percent or greater or such as a TiAlN metal fill layer comprising an atomic ratio of aluminum to titanium of 1:10 or more aluminum) is deposited by cyclic deposition to form a seamless gate fill of the trench 310. The increased aluminum content in the TiAlN may help to achieve formation of a seamless gate fill by cyclic deposition. In certain embodiments, the number of aluminum sub-cycles versus titanium sub-cycles for cyclic deposition of TiAlN is increased to increase the aluminum content of a TiAlN film deposited by cyclic deposition. In addition, cyclic deposition can help to fill short channel metal gates with small feature sizes (e.g., filling a short channel trench to form a short channel gate without voids).

Cyclical deposition in FIG. 5 is shown with pulses of gases with equal duration and in a saw-tooth pattern. Cyclical deposition may include pulses of gases of varying duration. Cyclical deposition may include pulses of any pattern, such as curved and/or spiked patterns.

Figure 6:
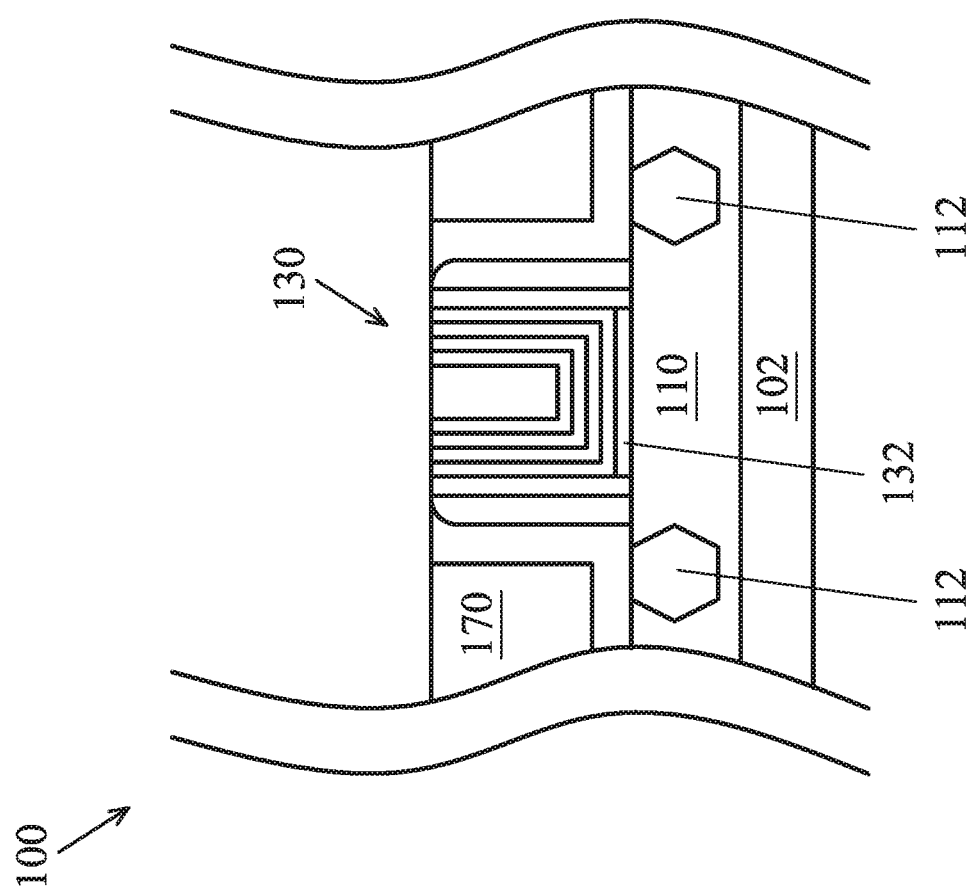
FIG. 6 is a schematic cross-sectional view of a semiconductor substrate at one stage of manufacturing a semiconductor device after performing a planarization process in accordance with some embodiments.

At block 260 of the method 200 of FIG. 2, the metal fill layer 160 of FIG. 4 may be planarized resulting in the semiconductor device 100 shown in FIG. 6 to form part of a gate structure 130. FIG. 6 is a schematic cross-sectional view of a semiconductor substrate 102 at one stage of manufacturing a semiconductor device by planarizing the metal fill layer 160. A planarization process may include a chemical mechanical polishing (CMP) process, for example.

In certain embodiments, the planarization process may remove excess metal fill layer 160, work function metal layer 148, barrier layer 144, capping metal layer 142, and high-k gate dielectric 140 from a top surface of the ILD 170.

The metal fill layer 160 may protect the layers there beneath, such as the work function metal layer 148 during planarizing or etch-back of the top surface of the substrate. For example, etching may undesirably change the properties and function of the work function metal layer 148 resulting in Vt instability. In comparison with another approach, the conformal metal fill layer 160 can provide a robust fill, helping to reduce the possibility of forming seams for an etchant path to impact the work function metal layer 148 of the gate structure 130. After planarization, the substrate 102 is further processed to form integrated circuit devices.

In certain embodiments of the method 200 of manufacturing a gate structure as shown in FIG. 3 to FIG. 6, seamless filling of a metal gate in a replacement gate process is provided by depositing TiAlN by cyclic deposition with an increased aluminum content.

Figure 7:
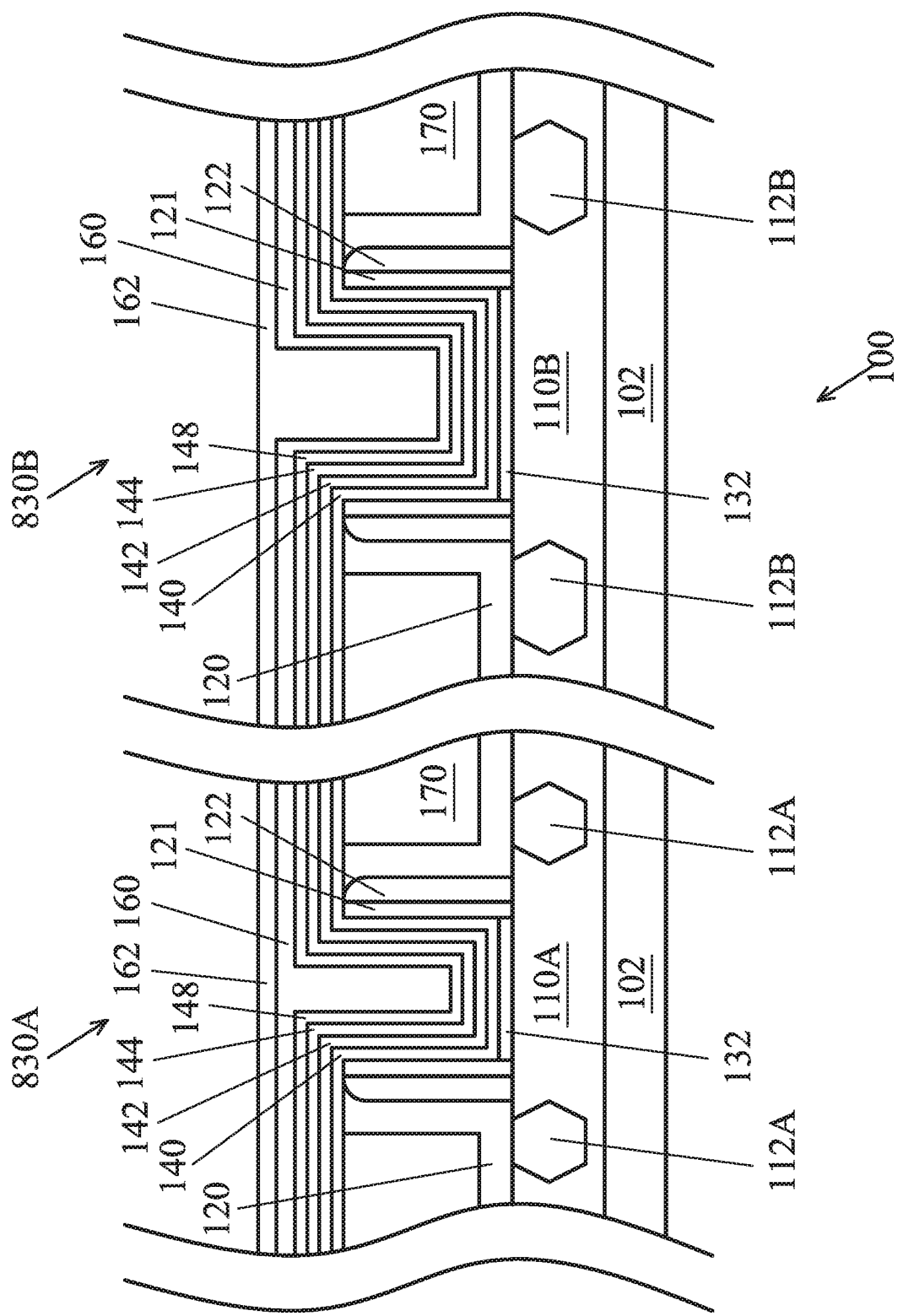
FIG. 7 is a schematic cross-sectional view of a semiconductor substrate at one stage of manufacturing a semiconductor device as part of a replacement gate process for a short channel gate structure and a longer channel gate structure according to some embodiments.
Figure 8:
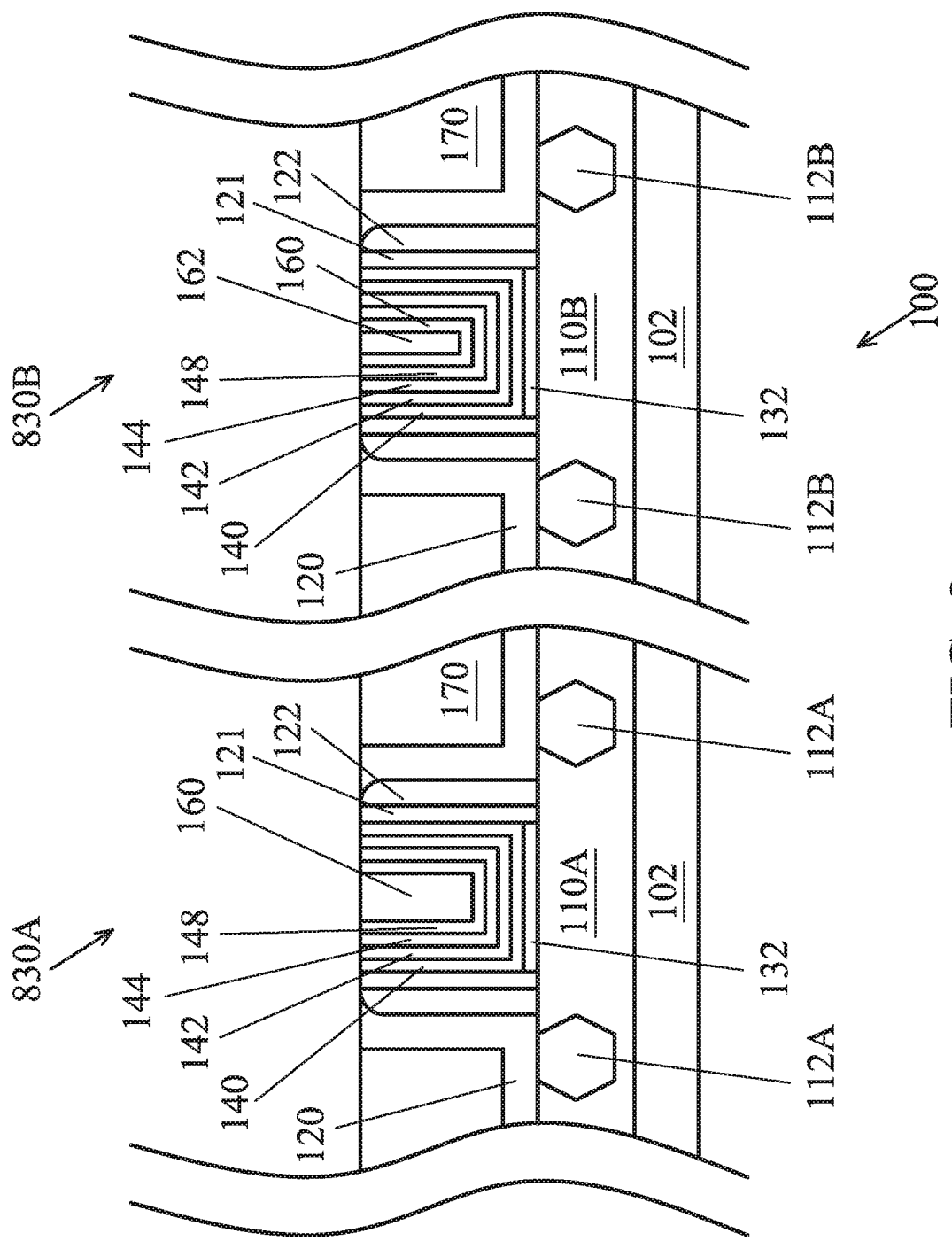
FIG. 8 is a schematic cross-sectional view of a semiconductor substrate at one stage of manufacturing a semiconductor device after performing a planarization process in accordance with some embodiments.

Other embodiments of the method 200 of manufacturing multiple gate structures are shown in FIG. 7 and FIG. 8. FIG. 7 is a schematic cross-sectional view of a semiconductor substrate 102 at one stage of manufacturing a semiconductor device 100 as part of a replacement gate process according to another embodiment. The substrate 102 has a short channel gate structure 830A and a longer channel gate structure 830B.

As illustrated, the trench formed by removing the dummy gate where the longer channel gate structure 830B is to be formed has a greater channel length than the trench formed by removing the dummy gate where the short channel gate structure 830A is to be formed. In some embodiments, forming the metal fill layer 160 may fill the trench for the short channel gate structure 830A, as shown in FIG. 7, but not completely fill the trench for the longer channel gate structure 830B because of the greater channel length. Hence, in some embodiments, a second metal fill layer 162 is deposited over the metal fill layer 160 to fill the trench for the longer channel gate structure 830B at block 250 of the method 200 of FIG. 2. The TiAlN layer 160 can act as a metal fill layer for a short channel gate structure 830A and can act as a glue layer for a second metal fill layer 162 for a longer channel gate structure 830B.

The second metal fill layer 162 may be a tungsten layer. The second metal fill layer 162 may be deposited by chemical vapor deposition (CVD), cyclic deposition, physical vapor deposition (PVD), or other suitable deposition processes. In some embodiments, the second metal fill layer 162 is deposited by CVD or cyclic deposition using a tungsten precursor, such as tungsten hexafluoride (WF$_6$), and a reducing gas, such as hydrogen gas. In other embodiments, the tungsten precursor may be other tungsten halides, bis(tertiarybutylimido) bis(tertiarybutylamido) tungsten ((tBuN)$_2$W(N(H)tBu)$_2$), bis(tertiarybutylimido) bis(dimethylamido) tungsten ((tBuN)$_2$W(NMe$_2$)$_2$), bis(tertiarybutylimido) bis(diethylamido) tungsten ((tBuN)$_2$W(NEt$_2$)$_2$), bis(tertiarybutylimido) bis(ethylmethylamido) tungsten ((tBuN)$_2$W(NEtMe)$_2$), or other suitable materials thereof.

In certain embodiments, the TiAlN layer 160 for both the short channel gate structure 830A and the longer channel gate structure 830B can help protect the underlying work function metal layer 148 from fluorine contamination or attack from using WF$_6$ to form the tungsten second metal fill layer 162, which may adversely impact the properties of the work function metal layer 148 resulting in Vt instability.

The substrate 102 of FIG. 7 may be further processed as shown in FIG. 8 according to block 260 of the method 200 of FIG. 2. FIG. 8 is a schematic cross-sectional view of a semiconductor substrate 102 at one stage of manufacturing a semiconductor device 100 by performing a planarization process. A planarization process may include a chemical mechanical polishing (CMP) process or other suitable planarization process. The planarization process may remove excess second metal fill layer 162, metal fill layer 160, work function metal layer 148, barrier layer 144, capping metal layer 142, and high-k gate dielectric layer 140 from a top surface of the ILD 170. After planarization, the substrate 102 is further processed to form integrated circuit devices.

The TiAlN layer 160 as a metal fill layer over the short channel gate structure 830A and the TiAlN layer 160 as a glue layer over a longer channel gate structure 830B may protect the layers there beneath, such as the work function metal layer 148 during planarizing or etch-back. For example, etching may undesirably change the properties and function of the work function metal layer 148 resulting in Vt instability. The TiAlN layer 160 can provide a robust fill without any seams for an etchant path to impact the work function metal layer 148 of the short channel gate structure 830A and can provide a glue layer for the second metal fill layer 162 for the longer channel gate structure 830B.

Figure 9:
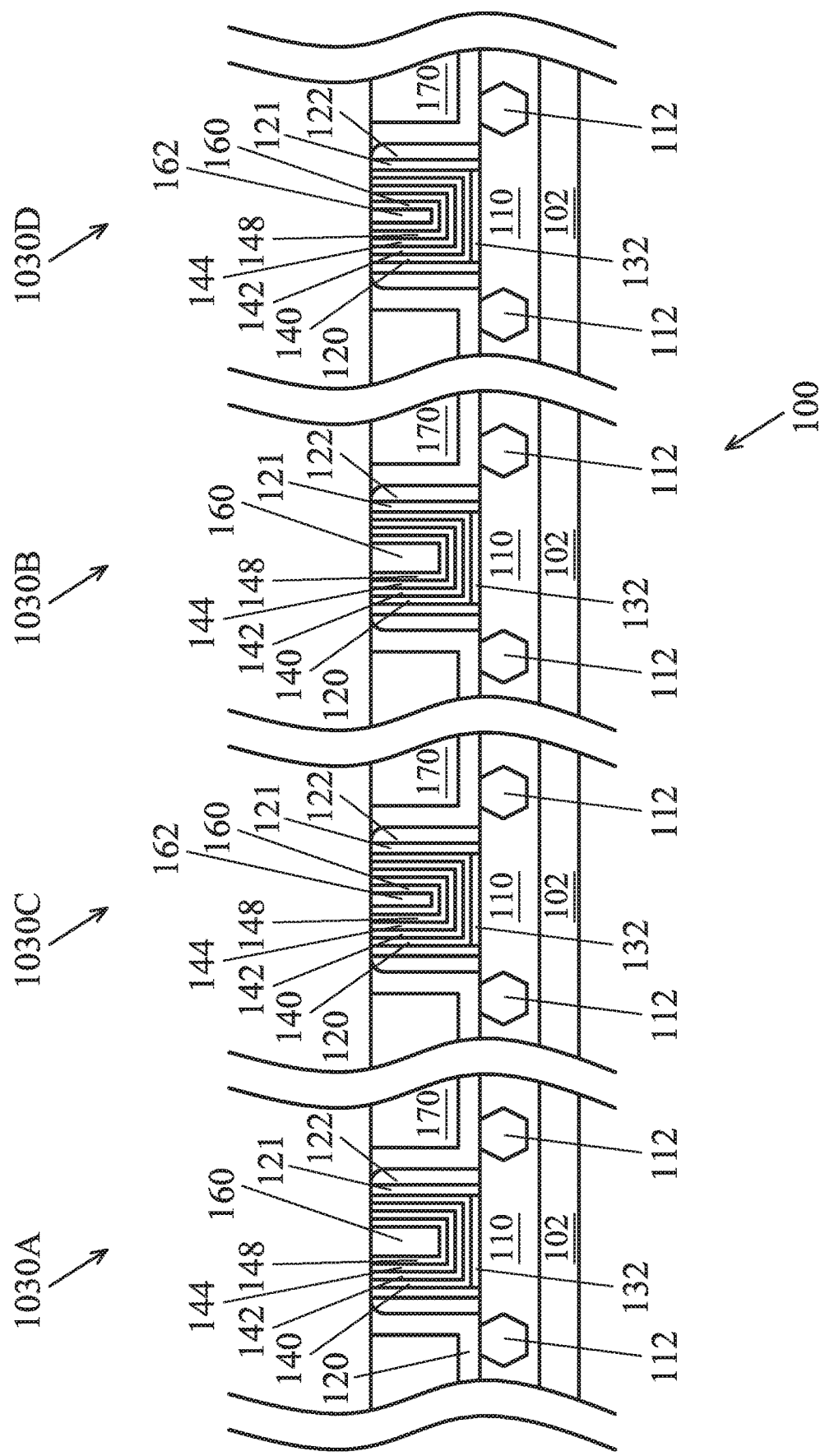
FIG. 9 is a schematic cross-sectional diagram of a semiconductor device formed over a substrate having a short channel gate structure for an n-type device, a long channel gate structure for an n-type device, a short channel gate structure for a p-type device, and a long channel gate structure for a p-type device in accordance with some embodiments.

FIG. 9 is a schematic cross-sectional diagram of a complementary semiconductor device 100 formed over a substrate 102 having a short channel gate structure 1030A for a first n-type FinFET device, a longer channel gate structure 1030C for a second n-type FinFET device, a short channel gate structure 1030B for a first p-type FinFET device, and a longer channel gate structure 1030D for a second p-type FinFET device in accordance with some embodiments. The semiconductor device 100 includes a semiconductor substrate 102 and semiconductor fins 110. The semiconductor fins 110 can be separated by isolation structures on the semiconductor substrate 102. The short channel gate structures 1030A, 1030B and the longer channel gate structures 1030C, 1030D are formed over respective semiconductor fins 110.

Offset spacers 121 and gate spacers 122 are formed on sidewalls of the short channel gate structures 1030A, 1030C and the longer channel gate structures 1030B, 1030D. Source/drain portions 112 are disposed in the respective semiconductor fin 110 on opposing sides of the respective gate structure 1030A, 1030B, 1030C, 1030D and proximate to respective offset spacers 121 and gate spacers 122. The source/drain portions 112, channel portions in the respective semiconductor fin 110, and the gate structures 1030A, 1030C can form respective n-type FinFET devices. The source/drain portions 112, channel portions in the respective semiconductor fin 110, and the gate structures 1030B, 1030D can form respective p-type FinFET devices. In some embodiments, an etch stop layer 120 overlies the gate spacers 122 and the source/drain portions 112. An inter-layer dielectric (ILD) 170 overlies the etch stop layer 120.

The gate structures 1030A-D may each include an interfacial dielectric 132, a high-k gate dielectric layer 140, a capping metal layer 142, a barrier metal layer 144, and a work function metal layer 148. A TiAlN layer 160 fills the short channel gate structures 1030A, 1030B. The TiAlN layer 160 may be deposited by cyclic deposition to form a seamless metal gate fill. The TiAlN layer 160 may have an increased aluminum content. The TiAlN layer 160 acts as a glue layer for the long channel gate structures 1030C, 1030D. A second metal fill layer 162 is formed filling the longer channel gate structures 1030C, 1030D and overlying the filled gate structures of the short channel gate structures 1030A, 1030B. A planarization, such as a CMP process, may be performed. The TiAlN layer 1160 can protect the underlying layers, such as the work function metal layer 1148, during planarization and/or during an etch.

The high aluminum content in comparison to other TiAlN films may provide for conformal deposition without forming a seam.

The TiAlN layer with high aluminum content may be used in complementary semiconductor devices, such as in node size 7 nm and below with smaller Fin-to-Fin and Poly-to-Poly pitch. The TiAlN layer with high aluminum content may be used as seamless metal fill layer in short channel FinFET devices and as a glue layer in long channel FinFET devices to form transistors with multiple threshold voltages Vts with minimal power leakage. In certain embodiments, the TiAlN layer protects the underlying work function layers of short channel FinFET devices and long channel FinFET devices providing increase Vt stability.

EXAMPLES

The following examples should not be used to limit the scope of the claims unless specifically recited as elements and limitations in the claims. The following examples were conducted to form TiAlN short channel metal gates. TiAlN layers were deposited in a Centura system from Applied Materials, Inc., located in Santa Clara, Calif., U.S.A. For the TiAlN deposition process, the precursor temperature was set in a range from 50° C. to 100° C.; the substrate temperature was set in a range from 400° C. to 500° C.; and the chamber pressure was set in a range from 5 torr to 50 torr.

Example 1

A TiAlN layer was deposited by cyclic deposition. A titanium deposition sub-cycle includes delivering a titanium precursor and a nitrogen precursor of ammonia gas to a surface of a substrate. A titanium precursor of titanium chloride with a carrier gas of argon was implemented. An aluminum deposition sub-cycle includes delivering an aluminum precursor and a nitrogen precursor of ammonia gas to the surface of the substrate. An aluminum precursor of aluminum chloride was delivered with a carrier gas of argon. The ratio of a number of aluminum sub-cycles to a number of titanium sub-cycles was 1:1.

An XPS compositional analysis was performed of the TiAlN layer. The composition was determined to have a ratio of aluminum to titanium atomic content of lower than 1:3. A SEM of the TiAlN after etching showed formation of an intrinsic seam in the TiAlN metal gate fill. The intrinsic seam provided an etching path causing damage to the work function layer there below.

Example 2

A TiAlN layer was deposited by cyclic deposition. A titanium deposition sub-cycle includes delivering a titanium precursor and a nitrogen precursor of ammonia gas to a surface of a substrate. A titanium precursor of titanium chloride was delivered with a carrier gas of argon. An aluminum deposition sub-cycle includes delivering an aluminum precursor and a nitrogen precursor of ammonia gas to the surface of the substrate. An aluminum precursor of aluminum chloride was delivered with a carrier gas of argon. The ratio of number of aluminum sub-cycles to number of titanium sub-cycles was 5:4.

An XPS compositional analysis was performed of the TiAlN layer. The composition was determined to have a ratio of aluminum to titanium atomic content in a range from 1:3 to 4:1. A SEM of the TiAlN after etching showed no seam.

In certain embodiments, a seamless metal fill layer comprises a ternary compound, such as titanium aluminum nitride (TiAlN). In certain embodiments, a seamless metal fill layer comprising TiAlN having a certain aluminum-to-titanium content. In certain embodiments, a seamless metal fill layer is deposited by cyclic deposition, such as atomic layer deposition, to provide conformal growth over a trench structure as part of a replacement metal gate. In certain embodiments, a seamless metal fill layer provides an etching-barrier layer to prevent damage to one or more layers there beneath, such as preventing damage to a work function metal layer. In certain embodiments, a seamless metal fill layer provides an etching-barrier layer with reduced short channel effects for short channel devices used to form multiple Vts devices. In certain embodiment, a seamless metal fill layer is used in to form short channel FinFET devices as part of complementary semiconductor devices.

Certain embodiments of a semiconductor device and a method of forming a semiconductor device comprise forming a high-k gate dielectric layer over a short channel semiconductor fin. A work function metal layer is formed over the high-k gate dielectric layer. The term "over" may include other layers therebetween. For example, a capping layer and/or barrier layer may be formed between the high-k gate dielectric layer and the work function metal layer. A seamless metal fill layer is conformally formed over the work function metal layer. The seamless metal fill layer may be formed by cyclic deposition, such as atomic layer deposition, of a TiAlN layer having a certain aluminum content.

Certain embodiments of a semiconductor device and a method of forming a semiconductor device comprise forming a high-k gate dielectric layer formed over a short channel semiconductor fin and over a long channel semiconductor fin. A work function metal layer is formed over the high-k gate dielectric layer. A capping layer and/or barrier layer may be formed between the high-k gate dielectric layer and the work function metal layer. A TiAlN layer is formed over the work function metal layer. The TiAlN layer forms a seamless metal fill layer over the short channel semiconductor fin and forms a glue layer over the long channel semiconductor fin. The TiAlN layer may be formed by cyclic deposition, such as atomic layer deposition, in which the TiAlN layer is formed to a certain aluminum content. A tungsten layer may be formed over the glue layer to form a metal fill layer over the long channel semiconductor fin.

An embodiment is a semiconductor device. The semiconductor includes a gate structure. The gate structure includes a high-k gate dielectric layer, a work function metal layer, and a seamless metal fill layer. The high-k gate dielectric layer is over a channel in a semiconductor fin. The work function metal layer is over the high-k gate dielectric layer. The seamless metal fill layer is over the work function metal layer.

Another embodiment is a method of forming a semiconductor device. A high-k gate dielectric layer is deposited over a semiconductor fin within a trench defined by spacers. A work function metal layer is deposited over the high-k gate dielectric layer. A metal fill layer is deposited filling the trench without any seams. The metal fill layer includes a titanium aluminum nitride.

A further embodiment is another method of forming a semiconductor device. A high-k gate dielectric layer is formed over a short channel semiconductor fin and over a long channel semiconductor fin. A work function metal layer is formed over the high-k gate dielectric layer. A titanium aluminum nitride layer is formed over the work function metal layer. The titanium aluminum nitride layer is a seamless metal fill layer over the short channel semiconductor fin and is a glue layer over the long channel semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    depositing a high-k gate dielectric layer over a first semiconductor fin within a first trench defined by top surfaces of first spacers and a second semiconductor fin within a second trench defined by top surfaces of second spacers;
    depositing a high-k dielectric layer in the first trench and the second trench;
    forming a capping layer directly on the high-k dielectric layer in the first trench and the second trench, the capping layer comprising one of tantalum nitride and titanium nitride;
    forming a barrier layer directly on the capping layer, the barrier layer comprising the other of tantalum nitride and titanium nitride;
    depositing a work function metal layer directly on the barrier layer;
    after depositing the work function metal layer, depositing a first metal fill layer directly on the work function metal layer in the first trench and the second trench, the first metal fill layer comprising titanium aluminum nitride, wherein the first metal fill layer comprises an atomic concentration of aluminum of between about 3% and about 20%, wherein the first metal fill layer conformally fills the first trench without any seams, wherein the first metal fill layer is deposited by cyclical deposition, the cyclical deposition comprising aluminum sub-cycles and titanium sub-cycles, wherein after depositing the first metal fill layer a region of the second trench interposed between the second spacers remains unfilled;

after depositing the first metal fill layer, depositing a second metal fill layer directly on the first metal fill layer, the second metal fill layer comprising tungsten, wherein the second metal fill layer fills the region of the second trench; and performing a planarization to level the work function metal layer, the first metal fill layer, and the second metal fill layer, wherein performing the planarization further forms a first transistor over the first semiconductor fin and a second transistor over the second semiconductor fin, wherein the first transistor and the second transistor comprise different threshold voltages, wherein performing the planarization further comprises using an etchant.

2. The method of claim 1, wherein the first metal fill layer is deposited with a number of the aluminum sub-cycles and a number of the titanium sub-cycles in a ratio in a range from 5:4 to 4:1.

3. The method of claim 2, wherein each of the aluminum sub-cycles comprises providing a pulse of an aluminum precursor and a pulse of a first nitrogen precursor, and wherein each of the titanium sub-cycles comprises providing a pulse of a titanium precursor and a pulse of a second nitrogen precursor.

4. The method of claim 1, wherein the performing the planarization comprising using the etchant further comprises etching the first metal fill layer without formation of a seam within the first metal fill layer.

5. The method of claim 1, wherein the first metal fill layer acts as an etch barrier layer protecting the work function metal layer in the first trench and the second trench.

6. The method of claim 1, wherein the high-k gate dielectric layer is conformally deposited within the first trench and the second trench.

7. The method of claim 1, wherein the first metal fill layer is conformally deposited within the first trench and the second trench.

8. A method of forming a semiconductor device, comprising:

forming a high-k gate dielectric layer in a first recess of a dielectric layer and directly over a short channel semiconductor fin and in a second recess of the dielectric layer over a long channel semiconductor fin;

after forming the high-k gate dielectric layer, forming a capping layer directly on the high-k gate dielectric layer and directly over the short channel semiconductor fin and the long channel semiconductor fin;

after forming the capping layer, forming a barrier layer directly on the capping layer and directly over the short channel semiconductor fin and the long channel semiconductor fin;

forming a work function metal layer over the high-k gate dielectric layer and over a top surface of the dielectric layer;

after forming the work function metal layer, forming a titanium aluminum nitride layer over and physically contacting the work function metal layer over the short channel semiconductor fin and over the long channel semiconductor fin, wherein the titanium aluminum nitride layer is disposed over the top surface of the dielectric layer, wherein the titanium aluminum nitride layer forms a seamless metal fill layer over the short channel semiconductor fin and forms a glue layer over the long channel semiconductor fin, the titanium aluminum nitride layer filling a remainder of the first recess, a remaining portion of the second recess being interposed between opposing sidewalls of the dielectric layer, forming the titanium aluminum nitride layer using deposition sub-cycles, the deposition sub-cycles comprising aluminum sub-cycles to form AlN molecules and titanium sub-cycles to form TiN molecules;

after forming the titanium aluminum nitride layer, forming a metal fill layer over and physically contacting the titanium aluminum nitride layer over the short channel semiconductor fin and over the long channel semiconductor fin, a first portion of the metal fill layer directly over the short channel semiconductor fin being entirely above the top surface of the dielectric layer, a second portion of the metal fill layer directly over the long channel semiconductor fin filling the remaining portion of the second recess, the metal fill layer comprising tungsten; and after forming the metal fill layer, performing a planarization to level the high-k gate dielectric layer, the capping layer, the barrier layer, the work function metal layer, wherein performing the planarization further forms a short channel semiconductor device comprising a first threshold voltage and a long channel semiconductor device comprising a second threshold voltage, wherein the first threshold voltage is different from the second threshold voltage.

9. The method of claim 8, further comprising forming a tungsten metal fill layer over the glue layer.

10. The method of claim 9, wherein the titanium aluminum nitride layer is further a second barrier layer during formation of the tungsten metal fill layer.

11. The method of claim 8, further comprising etching the titanium aluminum nitride layer.

12. The method of claim 11, wherein the titanium aluminum nitride layer is further an etch barrier layer.

13. A method of forming a semiconductor device, comprising:

forming a first dielectric layer over a first semiconductor fin and a second semiconductor fin, the first dielectric layer having a first recess over the first semiconductor fin and a second recess over the second semiconductor fin;

forming a high-k dielectric layer in the first recess and the second recess;

forming a capping layer over the high-k dielectric layer, the capping layer comprising a titanium nitride layer and a tantalum nitride layer;

forming a barrier layer over the capping layer;

forming a work function metal layer over and physically contacting the barrier layer in the first recess and the second recess;

after forming the work function metal layer, forming a titanium aluminum nitride layer over and physically contacting the work function metal layer in the first recess and the second recess, wherein the titanium aluminum nitride layer completely fills a first remaining portion of the first recess, wherein a second remaining portion of the second recess remains unfilled, the second remaining portion being interposed between opposing sidewalls of the first dielectric layer, wherein a first horizontal portion of the titanium aluminum nitride layer is disposed directly over a top surface of the first dielectric layer;

after forming the titanium aluminum nitride layer, forming a metal fill layer over and physically contacting the titanium aluminum nitride layer in the second recess, wherein the metal fill layer completely fills remaining portions of the second recess, wherein a second horizontal portion of the metal fill layer is disposed directly over the first horizontal portion and the top surface of the first dielectric layer; and after forming the metal fill layer, planarizing the high-k dielectric layer, the capping layer, the barrier layer, the work function metal layer, the titanium aluminum nitride layer, and the metal fill layer to have level top surfaces directly over the first semiconductor fin and the second semiconductor fin, wherein after the planarizing, a first fin field-effect transistor (FinFET) comprises the first semiconductor fin and a second FinFET comprises the second semiconductor fin, the first FinFET and the second FinFET having different threshold voltages.

14. The method of claim 13, wherein the first recess is narrower than the second recess.

15. The method of claim 13, wherein the titanium aluminum nitride layer is deposited by cyclical deposition, the cyclical deposition comprising a number of aluminum sub-cycles and a number of titanium sub-cycles, at least one of the aluminum sub-cycles or the titanium sub-cycles forming less than a monolayer.

16. The method of claim 15, wherein the number of the aluminum sub-cycles and the number of the titanium sub-cycles are in a ratio in a range from 5:4 to 4:1.

17. The method of claim 16, wherein the aluminum sub-cycles comprise providing a pulse of an aluminum precursor and a pulse of a nitrogen precursor, and wherein the titanium sub-cycles comprise providing a pulse of a titanium precursor and another pulse of the nitrogen precursor.

18. The method of claim 13, wherein an atomic ratio of aluminum to titanium of the titanium aluminum nitride layer is 1:10.

19. The method of claim 13, wherein the titanium aluminum nitride layer in the first recess is seamless.

20. The method of claim 3, wherein the first nitrogen precursor is different from the second nitrogen precursor.

* * * * *